United States Patent [19]

Gingerich

[11] 4,435,791
[45] Mar. 6, 1984

[54] CMOS ADDRESS BUFFER FOR A SEMICONDUCTOR MEMORY

[75] Inventor: Benjamin L. Gingerich, Palm Bay, Fla.

[73] Assignee: Harris Corporation, Melbourne, Fla.

[21] Appl. No.: 300,616

[22] Filed: Sep. 9, 1981

[51] Int. Cl.³ .............................................. G11C 7/00
[52] U.S. Cl. .................................. 365/230; 365/203; 307/238.3
[58] Field of Search .................. 307/238.3, 238.6, 362, 307/279; 365/174, 154, 190, 202, 203, 205, 230, 189

[56] References Cited
U.S. PATENT DOCUMENTS
3,860,831 1/1975 Goser .............................. 365/230 X

*Primary Examiner*—Joseph A. Popek
*Attorney, Agent, or Firm*—Leitner, Palan, Martin & Bernstein

[57] ABSTRACT

An input circuit for applying a supply voltage to the input/output voltage nodes of a regenerative latch in response to date inputs. A reference transistor applies a portion of the supply voltage to one node and a data transistor applies the full supply voltage to the other node in response to a data input signal. Write transistors control the connection of the data and reference transistors to the supply voltage. A precharge circuit is connected to the voltage nodes.

30 Claims, 2 Drawing Figures

4,435,791

CMOS ADDRESS BUFFER FOR A SEMICONDUCTOR MEMORY

BACKGROUND OF THE INVENTION

The present invention, in general, relates to an address buffer for a semiconductor memory and specifically, to a CMOS address latch circuit which is compatible with low level bipolar polar voltage levels, such as TTL.

Latching buffer circuits are well known in the prior art and serve to provide buffering between a computer memory and addressing circuitry which carries an input address to the memory. However, the voltage levels of the input address are often low bipolar voltage levels, such as are used in TTL, rather than the high voltage levels which are used by the MOS memory logic. These low voltages can be further degraded in value as the input address signal is gated into the buffer. For example, typical low and high TTL logic signals are 0.8 volts and 2.1 volts, respectively. A typical buffer circuit uses NMOS transistors which have a high threshold of approximately 2.0 volts. When the TTL logic high signal of 2.1 volts is gated across an input transistor in the buffer, it is conceivable that the resulting voltage will degrade to less than 2.0 volts. Therefore, should this input be now applied to the latch, it would be insufficient to turn ON an NMOS transistor therein, and the latch would not store the proper input value.

The prior art has provided a number of techniques to overcome this problem such as capacitive boosting of the low bipolar voltage levels. One such circuit is described in U.S. Pat. No. 4,038,567 to Lewis et al. In this circuit, the input voltage is boosted by a capacitor to ensure that the NMOS transistors are properly latched. However, even though this type of circuit has proven efficient, it still requires that the input signal be passed through an NMOS input transistor before being latched. The need for this extra transistor increases the cost of the buffer since associated timing circuitry is required for control thereof. Moreover, the boosting capacitors use up a finite area of the microchip, thus decreasing the size of the memory that can be fabricated thereon.

SUMMARY OF THE INVENTION

It is therefore an object of the instant invention to provide an improved buffer circuit for detecting memory address signals which is capable of accurately detecting low voltage level input signals.

It is another object of the instant invention to provide an improved buffer circuit which is extremely fast in operation and requires fewer gates and control circuitry than the prior art.

It is a further object of the instant invention to provide an improved buffer circuit which can accept a wider range of input signals.

It is yet another object of the instant invention to provide an improved buffer circuit which does not utilize boosting capacitors.

These and other objects of the present invention are attained by providing a buffer circuit for an address input of a semiconductor memory comprising regenerative latch means having first and second inpu/output voltage nodes. This regenerative latch means is connected to a supply voltage and includes a pair of cross-coupled inverter circuits for providing output signals in response to a data input signal. The instant invention provides an improved buffer circuit through the use of an input circuit means, connected between the supply voltage and the first and second input/output voltage nodes, for applying the supply voltage to the voltage nodes in response to the data input signal.

The input circuit means comprises a data input field effect transistor with the data input signal being applied to the gate thereof for controlling the application of the supply voltage to the first input/output voltage node. The input circuit means also includes a voltage reference field effect transistor with the gate thereof being biased by a voltage reference signal which has a value between the high and low logic levels of the data input signal. The voltage reference transistor applies a portion of the supply voltage to the second input/output voltage node.

The input circuit means further comprises a first write field effect transistor having its drain connected to the source of the data input transistor and its source connected to the supply voltage. Similarly, the input circuit means includes a second write field effect transistor having its drain connected to the source of the voltage reference transistor and its source connected to the supply voltage. The first and second write transistors form a write circuit means connected to the regenerative latch means for controlling the operation of the input circuit means.

The buffer also includes a precharge circuit connected to the regenerative latch means. The precharge circuit includes first precharge means for selectively applying the supply voltage to the input/output voltage nodes, and a second precharge means for selectively connecting the regenerative latch means to ground. The first precharge means includes first and second precharge field effect transistors which are connected to first and second input/output voltage nodes, respectively. In particular, first and second precharge transistors each have their source terminal connected to the supply voltage and their drain terminal connected to the input/output voltage nodes. The second precharge means includes a third precharge field effect transistor having its drain connecting the regenerative latch means to ground.

The buffer circuit further includes a signal control means for applying signals to the write circuit means and the first and second precharge means, for controlling the voltages at the input/output voltage nodes. In particular, the signal control means applies a PRE-CHARGE signal having a precharge portion and a non-precharge portion. Similarly, the signal control means applies a WRITE signal having a write portion and non-write portion. In operation of the buffer, the precharge portion of the PRECHARGE signal is initially applied to the first precharge means for connecting the supply voltage to the first and second input/output voltage nodes. The precharge portion is also applied to the second precharge means for disconnecting the regenerative latch means from ground. Simultaneously, the non-write portion of the WRITE signal is applied to the write circuit means for enabling the data input means and the voltage reference means to connect the supply voltage to the input/output voltage nodes. The non-precharge portion of the PRECHARGE signal is subsequently applied to the precharge circuit thereby causing the second precharge means to connect the regenerative latch means to ground. This causes the latch means to toggle in response to the relative amounts of supply voltage applied to the input/output voltage nodes by the data input means and the voltage reference means. Thereafter, the write portion of the WRITE signal disconnects the input circuit means from the regenerative latch means such that the latch means remains in the toggled state until the precharge portion of the PRECHARGE signal is again applied to the precharge circuit.

The write circuit means, date input means, voltage reference means, and first precharge means comprise p-channel MOS devices while the second precharge means comprises an n-channel MOS device.

DESCRIPTION OF THE PREFERRED EMBODIMENT

Figure 1:
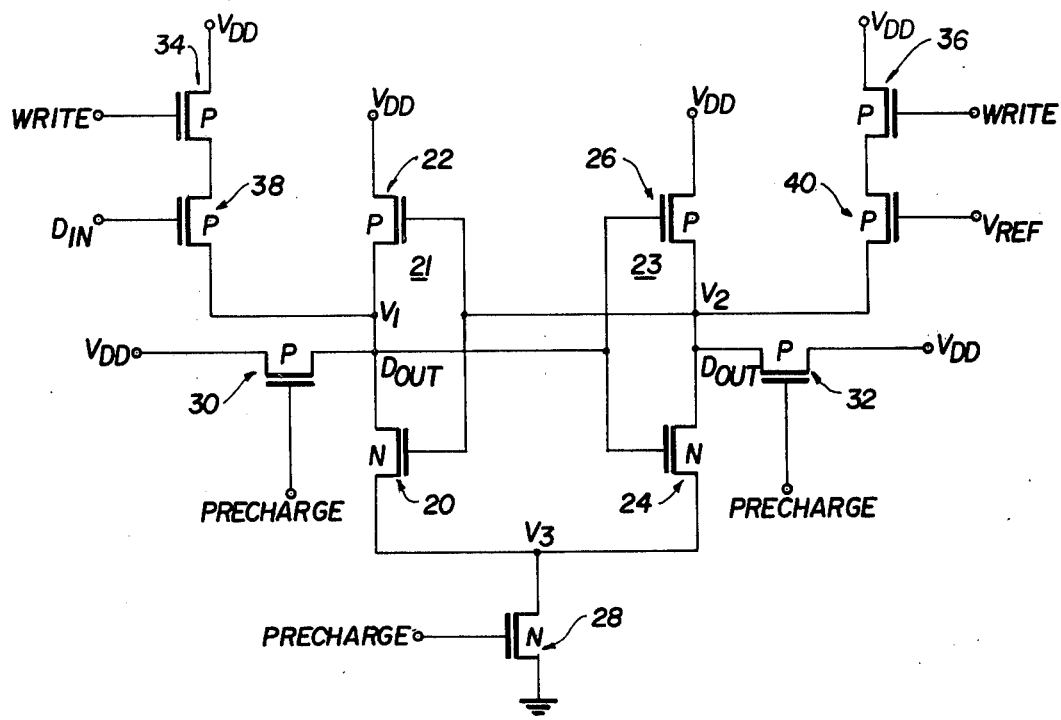
FIG. 1 shows a detailed circuit schematic of the preferred embodiment of the instant invention.

Referring now to FIG. 1, the CMOS address latch circuit of the instant invention is shown in detail. This circuit discloses a single MOS RAM latch cell comprising a pair of cross-coupled inverters 21 and 23 which serve to store the data bit, as is well known in the prior art. More specifically, inverter 23 comprises an n-channel driver transistor 20 and a p-channel load transistor 22. Transistors 24 and 26 serve correspondingly for the other inverter 22. In inverter 21, the drains of the n-channel and p-channel transistors 20 and 22 are joined at node $V_1$, and the supply voltage $V_{DD}$ is applied to the source of p-channel transistor 22. Node $V_1$ serves as the inverted data output $D_{OUT}$ and as an input to the latch. Similarly, in inverter 23, the drains of the n-channel and p-channel transistors 24 and 26 are joined at node $V_2$, and the supply voltage is applied to the source of the p-channel transistor 26. Node $V_2$ serves as the non-inverted data output $D_{OUT}$ and as a second input to the latch. The nodes $V_1$ and $V_2$ form first and second input/output voltage nodes. The gates of transistors 20 and 22 are connected and tied to node $V_2$ while the gates of transistors 24 and 26 are connected and tied to node $V_1$, such that the inverter 21 and 23 are cross-coupled. The sources of the n-channel transistors 20 and 24 are tied together at node $V_3$. The cross-coupled inverters 21 and 23 thus form a regenerative latch means.

A precharge circuit comprising precharge field effect transistors 28, 30 and 32 is also provided in the circuit of FIG. 1. In particular, first and second p-channel precharge transistors 30 and 32 comprise a first precharge means and third n-channel precharge transistor 28 comprises a second precharge means. The drain of the n-channel precharge transistor 28 is tied to node $V_3$ while the source of this transistor is at ground potential. The drains of the p-channel precharge transistors 30 and 32 are tied to input/output nodes $V_1$ $V_2$, respectively, while the sources of these transistors are tied to the supply voltage $V_{DD}$. The input signals on the gates of the precharge transistors 28, 30 and 32 are provided by a PRECHARGE signal as will be described in detail below with reference to FIG. 2.

The CMOS address latch of the instant invention includes a novel input circuit means comprising first and second write field effect transistors 34 and 36, data input field effect transistor 38, and voltage reference transistor 40. The first and second write transistors 34 and 36 form a write circuit means for controlling the operation of the input circuit means. The data input transistor 38 comprises a data input means and the voltage reference transistor 40 comprises a voltage reference means. Referring back to FIG. 1, the drain of the first write transistor 34 is connected to the source of the data input transistor 38, while the drain of the second write transistor 36 is connected to the source of the voltage reference transistor 40. The sources of the write transistors 34 and 36 are connected to the supply voltage $V_{DD}$ while the gate inputs of these transistors are provided by a WRITE signal, as will be discussed below. The drains of the data input transistor 38 and the voltage reference transistor 40 are connected to the first and second input/output voltage nodes $V_1$ and $V_2$, respectively. The input to the gate of the data input transistor 38 is provided by the data input signal $D_{IN}$ while the input to the gate of the voltage reference transistor 40 is provided by a reference voltage $V_{REF}$. The reference voltage has a value which is, in the preferred embodiment, exactly halfway between the high and low logic levels of the data input signal.

It is an important feature of the instant invention that both the data input $D_{in}$ and the reference voltage $V_{ref}$ signals are applied to the gates of the data input and voltage reference transistors 38 and 40. In the prior art, the low level input signal is typically gated through an NMOS input transistor and applied directly to the input/output signals of the latch. Since this input NMOS transistor has an associated threshold drop, the input signal is often degraded in value just enough such that it cannot properly be latched into the buffer. In the circuit of FIG. 1, the input signal $D_{in}$ and the voltage reference $V_{ref}$, are used to gate the data input and voltage reference transistors 38 and 40. Therefore, a large portion of the supply voltage $V_{DD}$ is gated across these transistors and applied to the input/output nodes of the latch. This ensures that the n-channel load transistors 20 and 24 can be properly latched by a logic high input signal. It should be noted that p-channel transistors are used as the data input and voltage reference transistors since the reference voltage is 1.4 volts. This gate voltage is sufficient to keep the p-channel voltage reference transistor 40 ON at all times during the operation of the circuit for proper referencing.

To facilitate the understanding of the operation of FIG. 1, it should be noted that p-channel transistors of FIG. 1 are turned ON whenever their gate inputs are logic low and are turned OFF when these inputs are logic high. Similarly, the n-channel transistors are turned ON whenever their gate inputs are logic high and are turned OFF when these inputs are logic low. In operation of the circuit of FIG. 1, the logic high input voltage for the transistors will be assumed to be approximately 2.0 volts while the logic low input is approximately 0.8 volts.

Figure 2:
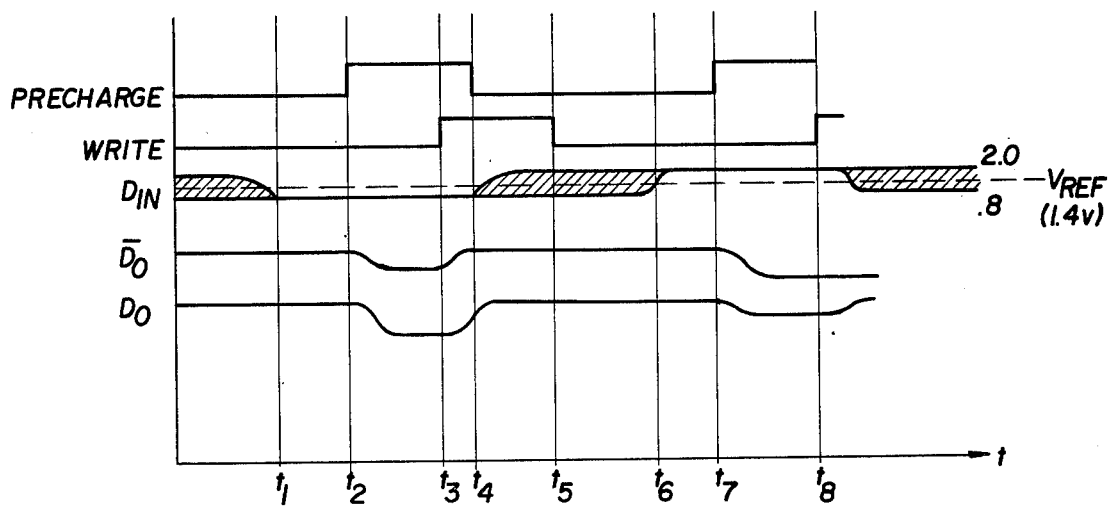
FIG. 2 is a timing diagram showing the signals provided by the signal control means and the corresponding input and output signal waveforms.

The operation of the CMOS address latch of FIG. 1 can best be explained by examining the circuit in conjunction with the timing diagram seen in FIG. 2. Referring now to this latter figure, assume that at time $t_1$ the precharge signal PRECHARGE, the write signal WRITE, and the data input $D_{in}$ to be written into the latch, are logic low. Under these conditions p-channel precharge transistors 30 and 32 are ON and the supply voltage $V_{DD}$ is applied to precharge first and second input/output voltage nodes $V_1$ and $V_2$ to $V_{DD}$. The n-channel precharge transistor 28, however, is OFF since the precharge signal is logic low. Since $V_1=V_2=V_{DD}$, the n-channel drive transistors 20 and 24 are ON and the p-channel load transistors 22 and 26 are OFF at time $t_1$. However, the nodes $V_1$ and $V_2$ do not discharge through transistors 20 and 24 since transistor 28 is OFF. The write transistors 34 and 36 will also be ON given the logic low WRITE signal. The data input transistor 38 is ON since $D_{in}=0$. Similarly, the voltage reference transistor 40 is ON since $V_{REF}$ is less than the logic high threshold voltage which would turn this transistor OFF.

It should be noted that the PRECHARGE and WRITE signals are produced by a signal control means, and are applied to the write circuit means and the first and second precharge means to control the voltages at the input/output voltage nodes. In particular, a logic low signal defines the precharge portion of the PRECHARGE signal and the non-write portion of the WRITE signal. Similarly, a logic high signal defines the non-precharge portion of the PRECHARGE signal and the write portion of the WRITE signal. The signal control means is not shown in detail since it is well known in the prior art and by itself forms no part of the instant invention. In the preferred embodiment of the invention, the PRECHARGE and WRITE signals are derived from the same signal source. In particular, the PRECHARGE signal is applied to a delay circuit within the signal control means to form the WRITE signal. In operation, the PRECHARGE signal rises and falls approximately 10–15 nsecs. before the subsequent rise and fall of the WRITE signal. It should be noted that the duty cycle of the signal pulses is not critical as long as the above sequence of the PRECHARGE and WRITE signals are used.

Assume now that at time $t_2$ the logic high non-precharge portion of the PRECHARGE signal is applied to the precharge transistors. This signal serves to turn OFF p-channel precharge transistors 30 and 32 and turn ON n-channel precharge transistor 28. Since the n-channel drive transistors 20 and 24 of the cross-coupled inverters remain ON, the voltage at nodes $V_1$ and $V_2$ begin to decrease towards ground through transistors 20 and 28, and transistors 24 and 28, respectively. However, since data input transistor 38 and first write transistor 34 are ON at time $t_2$, the voltage at node $V_1$ will only decrease slightly since these transistors are tied to the supply voltage. The overall voltage drop at node $V_1$ will be due to the voltage drop across transistors 34 and 38, which is minimal. The voltage at $V_2$, however, will decrease to a lower value than the voltage at node $V_1$ due to the finite voltage drop across voltage reference transistor 40, which is biased by the reference voltage $V_{REF}$.

At time $t_3$, it is assumed that the WRITE signal goes logic high, indicating that the data input $D_{in}$ is to be written into the address latch cell. This write portion of the WRITE signal turns OFF the first and second write transistors 34 and 36 and therefore the input circuits cannot provide any positive voltage to nodes $V_1$ and $V_2$. However, at time $t_3$, the voltage at node $V_2$ has decreased to a point which is low enough compared to the voltage at node $V_1$ to toggle the cross-coupled inverters 21 and 23. In particular, the logic low signal at node $V_2$ turns ON p-channel load transistor 22 and turns OFF n-channel drive transistor 20 of inverter 21. Thus the voltage at node $V_1$ will then be maintained at $V_{DD}$ by p-channel transistor 22. Similarly, the logic high signal at node $V_1$ keeps the p-channel load transistor 26 of inverter 23 OFF and the n-channel drive transistor 24 of this inverter ON. Thus, the voltage at node $V_2$ is maintained at logic low by n-channel transistor 24. Therefore, the noninverted output $D_{out}$ at node $V_2$ is at logic low and the inverted output $\overline{D}_{out}$ at node $V_1$ is at logic high, as required by the logic low data input $D_{in}=0$.

The circuit will remain in the above state until the nodes $V_1$ and $V_2$ are again precharged to $V_{DD}$. As seen in FIG. 2, this will begin to occur at time $t_4$, when the PRECHARGE signal returns to the logic low state and must be completed by $t_5$. In particular, at this time, the p-channel precharge transistors 30 and 32 turn ON such that nodes $V_1$ and $V_2$ are again precharged to the supply voltage $V_{DD}$. As state above, the precharging of the output nodes causes n-channel drive transistors 20 and 24 to be ON and p-channel load transistors 22 and 26 to be OFF.

Referring to FIG. 2, assume that at time $t_5$ the WRITE signal returns to the logic low state. At this time, the first and second write transistors 34 and 36 turn ON. Nodes $V_1$ and $V_2$, however, have already been precharged to $V_{DD}$ such that the circuit is now completely reset. It should be noted that the WRITE signal must go to logic low after the PRECHARGE signal does so for the circuit to operate correctly. This operation provides for a quick reset of the logic cell after the data has been written in and read out.

Assume now that a time $t_6$ the data input bit $D_{in}$ goes to logic high as shown in FIG. 2. At this time, the data input transistor 38 will have its drive capability reduced to less than that of the voltage reference transistor 40, which will be ON since the reference voltage $V_{REF}$ is still less than the logic high threshold voltage which would turn the transistor OFF. The drive transistors 20 and 24 of the cross-coupled inverters will also be ON while the load transistors 22 and 26 are OFF. Note, however, that at time $t_6$, the voltages at nodes $V_1$ and $V_2$ will still be at the supply voltage $V_{DD}$ due to the precharge portion of the PRECHARGE signal being logic low, which turns ON transistors 30 and 32.

At time $t_7$, assume that the logic high non-precharge portion of the PRECHARGE signal is again applied to the precharge transistors. When this occurs, p-channel precharge transistors 30 and 32 are turned OFF and n-channel precharge transistor 28 is turned ON. Since the n-channel drive transistors 20 and 24 of the cross-coupled inverters remain ON, the voltages at nodes $V_1$ and $V_2$ begin to decrease towards ground through transistors 20 and 28, and transistors 24 and 28 respectively. However, since data input transistor 38 is OFF at $D_{in}1$ and voltage reference transistor 40 is ON due to the $V_{REF}$ bias, the voltage at node $V_1$ will decrease to a lower value than the voltage at node $V_2$. In particular, since data input transistor 38 is OFF, node $V_1$ is not connected to any source of positive voltage. Note, however, that node $V_2$ is supplied by the finite voltage across voltage reference transistor 40, which is biased by the reference voltage $V_{REF}$.

Referring back to FIG. 2, the logic high data bit is written into the cell at time at $t_8$. In particular, when the logic high write portion of the WRITE signal is applied to write circuit, the first and second write transistors 34 and 36 turn OFF and the input circuit is isolated from nodes $V_1$ and $V_2$. However, by time $t_8$, the logic levels at nodes $V_1$ and $V_2$ serve to toggle the cross-coupled inverters as described above. Specifically, the logic low at node $V_1$ turns ON p-channel load transistor 26 of inverter 23 to keep node $V_2$ at the logic high level.

Similarly, the logic high signal at node $V_2$ keeps p-channel load transistor 22 of inverter 21 OFF such that node $V_1$ is at the logic low level. Therefore, the non-inverted output $\overline{D}_{out}$ at node $V_2$ is at logic high and the inverted output $D_{out}$ is at logic low, as required by the logic high data input $D_{in}=1$. The circuit will remain in this state until the PRECHARGE signal returns to the logic low state.

In can therefore be seen that the present circuit provides a simple, yet efficient address buffer which is capable of accurately detecting low voltage level input signals. In particular, it should be noted that the input $D_{in}$ and reference voltage $V_{REF}$ signals are advantageously utilized to gate approximately the full supply voltage $V_{DD}$ to control the address latch. This ensures that the n-channel load transistors 20 and 24 of the cross-coupled inverters 21 and 23 will always be sufficiently biased when the low voltage TTL input signal represents a logic high input. The use of the data input $D_{in}$ and reference voltage $V_{REF}$ as gate signals further allows for simpler operation of the latch circuit since neither an extra input NMOS transistor, nor boosting capacitor are required to gate the input signal or reference voltage into the latch, as in the prior art. Moreover, since the extra input transistor is not required the present circuit utilizes fewer timing signals than the prior art buffers. Finally, the instant invention allows a wider range of input signals since the input signal is only used to gate the data input transistor 38. Specifically, the data input is not applied directly to the latch input and output nodes, and therefore the input range is not overly critical.

Although the invention has been described and illustrated in detail, it is clearly understood the same is by way of illustration and example only and is not to be taken by way of limitation. The spirit and scope of the present invention are to be limited only by the terms of the appended claims.

What is claimed is:

1. In a buffer circuit for an address input of a semiconductor memory comprising regenerative latch means having first and second input/output voltage nodes, said regenerative latch means connected to a supply voltage and including a pair of cross-coupled inverter circuits for providing output signals in response to a data input signal, the improvement comprising an input circuit including:
    a write transistor having a gate for receiving a write signal, a source connected to said supply voltage, and a drain;
    a data input transistor having a gate for receiving said data input signal, a source connected to said drain of said write transistor and a drain connected to said first input/output voltage node;
    said input circuit applying said supply voltage to said first input/output voltage node in response to said data input and said write signals.

2. A buffer circuit as defined in claim 1 wherein said data input transistor and said write transistor are p-channel MOS devices.

3. In a buffer circuit for an address input of a semiconductor memory comprising regenerative latch means having first and second input/output voltage nodes, said regenerative latch means connected to a supply voltage and including a pair of cross-coupled inverter circuits for providing output signals in response to a data input signal, the improvement comprising an input circuit means including:
    a data input transistor having a source-drain connecting said supply voltage and said first input/output voltage node and a gate for receiving said data signal for controlling the application of said supply voltage to said first input/output voltage node; and
    a voltage reference transistor having a source-drain connecting said supply voltage and said second input/output voltage node and a gate biased by a voltage reference signal which has a value between the high and low logic levels of said data input signal.

4. A buffer circuit as defined in claim 3 wherein said input circuit means further includes a first write transistor having a gate, a drain, a source; said drain of said first write transistor being connected to said source of said data input transistor, said source of said first write transistor being connected to said supply voltage.

5. A buffer circuit as defined in claim 3 wherein said input circuit means further includes a second write transistor having a gate, a drain, and a source; said drain of said second write transistor being connected to said source of said voltage reference transistor, said source of said second write transistor being connected to said supply voltage.

6. In a buffer circuit for an address input of a semiconductor memory comprising regenerative latch means having first and second input/output voltage nodes, said regenerative latch means connected to a supply voltage and including a pair of cross-coupled inverter circuits for providing output signals in response to a data input signal, the improvement comprising:
    an input circuit means connected between said supply voltage and said first and second input/output voltage nodes of said regenerative latch means for applying said supply voltage to said first and second input/output voltage nodes in response to said data input signal; and
    a precharge circuit connected to said regenerative latch means and including first precharge means for selectively applying said supply voltage to said input/output voltage nodes, and a second precharge means for selectively connecting said regenerative latch means to ground.

7. A buffer circuit as in claim 6 wherein said voltage reference transistor and said second write transistor are p-channel MOS devices.

8. A buffer circuit as defined in claim 6 wherein said first precharge means comprises a first precharge transistor connected to said first input/output voltage node and a second precharge transistor connected to said second input/output voltage node; said first precharge transistor having a source terminal connected to said supply voltage and a drain terminal connected to said first input/output voltage node, said second precharge transistor having a source terminal connected to said supply voltage and a drain terminal connected to said second input/output voltage node.

9. A buffer circuit as defined in claim 8 wherein said first and second precharge transistors are p-channel MOS devices.

10. A buffer circuit as defined in claim 8 wherein said second precharge means includes a third precharge transistor having a gate, a drain, and a source; said drain of said third precharge transistor connecting said regenerative latch means to ground.

11. A buffer circuit as defined in claim 10 wherein said third precharge transistor is an n-channel MOS device.

12. In a buffer circuit for an address input of a semiconductor memory comprising regenerative latch means having first and second input/output voltage nodes, said regenerative latch means connected to a supply voltage and including a pair of cross-coupled inverter circuits for providing output signals in response to a data input signal, the improvement comprising:

an input circuit means connected between said supply voltage and said first and second input/output voltage nodes of said regenerative latch means for applying said supply voltage to said first and second input/output voltage nodes in response to said data input signal; and a write circuit means connected to said regenerative latch means for controlling operation of said input circuit means in response to a write signal.

13. A buffer circuit as defined in claim 12 wherein said input circuit means further includes data input means responsive to said data input signal for applying substantially the entire supply voltage to said first input/output voltage node, and voltage reference means responsive to a voltage reference signal for applying a portion of said supply voltage to said second input/output voltage node; said data input means and said voltage reference means being controlled by said write circuit means.

14. A buffer circuit as defined in claim 13, wherein said data input means comprises a data input transistor having a gate, a drain, and a source; said data input signal being applied to said gate for controlling the application of said supply voltage to said first input/output voltage node.

15. A buffer circuit as defined in claim 14 wherein said write circuit means includes a first write transistor having a gate, a drain, and a source; said drain of said first write transistor being connected to said source of said data input transistor, said source of said first write transistor being connected to said supply voltage.

16. A buffer circuit as defined in claim 15 wherein said data input transistor and said first write transistor are p-channel MOS devices.

17. A buffer circuit as defined in claim 14 wherein said voltage reference means comprises a voltage reference transistor having a gate, a drain, and a source; said gate being biased by said voltage reference signal which has a value between the high and low logic levels of said data input signal.

18. A buffer circuit as defined in claim 17 wherein said write circuit means further includes a second write transistor having a gate, a drain, and a source; said drain of said second write transistor being connected to said source of said voltage reference transistor, said source of said second write transistor being connected to said supply voltage.

19. A buffer circuit as in claim 18 wherein said voltage reference transistor and said second write transistor are p-channel MOS devices.

20. A buffer circuit as defined in claim 13 further including a precharge circuit including first precharge means for selectively applying said supply voltage to said input/output voltage nodes, and a second precharge means for selectively connecting said regenerative latch means to ground.

21. A buffer circuit as defined in claim 20 wherein said first precharge means comprises a first precharge transistor connected to said first input/output voltage node and a second precharge transistor connected to said second input/output voltage node; said first precharge transistor having a source terminal connected to said supply voltage and a drain terminal connected to said first input/output voltage node, said second precharge transistor having a source terminal connected to said supply voltage and a drain terminal connected to said second input/output voltage node.

22. A buffer circuit as defined in claim 21 wherein said first and second precharge transistors are p-channel MOS devices.

23. A buffer circuit as defined in claim 21 wherein said second precharge means includes a third precharge transistor having a gate, a drain, and a source; said drain of said third precharge transistor connecting said regenerative latch means to ground.

24. A buffer circuit as defined in claim 23 wherein said third precharge transistor is an n-channel MOS device.

25. A buffer circuit as defined in claim 20 further including signal control means for applying signals to said write circuit means and said first and second precharge means to control the voltages at said input/output voltage nodes.

26. A buffer circuit as defined in claim 25 wherein said signal control means applies a PRECHARGE signal, and PRECHARGE signal including a precharge portion which is initially applied to said first precharge means for connecting said supply voltage to said first and second input/output voltage nodes, and applied to said second precharge means for disconnecting said regenerative latch means from ground.

27. A buffer circuit as defined in claim 26 wherein said signal control means further applies a WRITE signal; said WRITE signal including a non-write portion which is applied to said write circuit means simultaneously with said precharge portion of said PRECHARGE signal for enabling said data input means and said voltage reference means to connect said supply voltage to said input/output voltage nodes.

28. A buffer circuit as defined in claim 27 wherein said PRECHARGE signal includes a non-precharge portion which when applied to said second precharge means simultaneously with said non-write portion of said WRITE signal, connects said regenerative latch means to ground such that said latch means can toggle in response to the relative amounts of said supply voltage applied to said input/output voltage nodes by said data input means said voltage reference means, and said write circuit means.

29. A buffer circuit as defined in claim 28 wherein said WRITE signal includes a write portion which when applied to said write circuit means disconnects said input circuit means from said regenerative latch means such that said latch means remains in said toggled state until said signal control means applies said precharge portion of said PRECHARGE signal to said first and second precharge means.

30. A buffer circuit as defined in claim 27 wherein said signal control means forms said WRITE signal by delaying said PRECHARGE signal by a predetermined time.

* * * * *

UNITED STATES PATENT AND TRADEMARK OFFICE
CERTIFICATE OF CORRECTION

PATENT NO. : 4,435,791
DATED : March 6, 1984
INVENTOR(S) : Benjamin L. Gingerich It is certified that error appears in the above—identified patent and that said Letters Patent is hereby corrected as shown below:

Column 1, line 10, delete "polar".

Column 3, line 9, delete "date" and insert --data--.

line 32, delete "22" and insert --23--.

line 35, delete "$D_{OUT}$" and insert --$\overline{D}_{OUT}$--.

Column 4, line 17, delete "$D_{IN}$" and insert --$D_{in}$--.

line 19, delete "$V_{REF}$" and insert --$V_{ref}$--.

Column 6, line 14, delete "state" and insert --stated--.

Column 7, line 4, delete "$\overline{D}_{out}$" and insert --$D_{out}$--.

line 5, delete "$D_{out}$" and insert --$\overline{D}_{out}$--.

Signed and Sealed this

Fourteenth Day of August 1984

[SEAL]

Attest:

GERALD J. MOSSINGHOFF

Attesting Officer

Commissioner of Patents and Trademarks